US007554127B2

United States Patent
Tanaka et al.

(10) Patent No.: US 7,554,127 B2
(45) Date of Patent: Jun. 30, 2009

(54) SEMICONDUCTOR LIGHT-EMITTING ELEMENT AND METHOD OF MANUFACTURING THE SAME

(75) Inventors: Akira Tanaka, Yokohama (JP); Masaaki Onomura, Tokyo (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 0 days.

(21) Appl. No.: 10/917,521

(22) Filed: Aug. 13, 2004

(65) Prior Publication Data

US 2005/0040384 A1 Feb. 24, 2005

(30) Foreign Application Priority Data

Aug. 20, 2003 (JP) ............... P2003-296423
Aug. 4, 2004 (JP) ............... P2004-227579

(51) Int. Cl.
*H01L 31/0304* (2006.01)
(52) U.S. Cl. .............. 257/95; 257/94; 257/E33.028
(58) Field of Classification Search ............ 257/79, 257/94, 96, 97, E33.027, E33.028, 95; 372/44.01, 372/45.01, 44.05, 44.06
See application file for complete search history.

(56) References Cited

U.S. PATENT DOCUMENTS

| | | | | |
|---|---|---|---|---|
| 6,015,979 A * | 1/2000 | Sugiura et al. | ............... | 257/86 |
| 6,252,894 B1 * | 6/2001 | Sasanuma et al. | ......... | 372/45.01 |
| 6,434,178 B1 * | 8/2002 | Ubukata | ............... | 372/45.011 |
| 6,586,762 B2 * | 7/2003 | Kozaki | ............... | 257/14 |
| 6,907,056 B2 * | 6/2005 | Botez | ............... | 372/43.01 |
| 2002/0094002 A1 * | 7/2002 | Amano et al. | ............... | 372/45 |
| 2003/0001168 A1 * | 1/2003 | Tsuda et al. | ............... | 257/103 |

FOREIGN PATENT DOCUMENTS

| | | |
|---|---|---|
| JP | 10-056236 | 2/1998 |
| JP | 10-145000 A | 5/1998 |
| JP | 10-145002 A | 5/1998 |
| JP | 11-340580 | 12/1999 |
| JP | 2000-299497 | 10/2000 |
| JP | 2002-335052 A | 11/2002 |
| JP | 2003-115641 A | 4/2003 |
| JP | 2003-204122 A | 7/2003 |

OTHER PUBLICATIONS

English translation (machine translation) of JP 2003-115641.*
Japanese Office Action dated Jan. 30, 2007 im Application No. JP2004-227579.
Final Office Action in Japanese Application No. 2004-227579 mailed May 29, 2007.

* cited by examiner

*Primary Examiner*—Allan R. Wilson
(74) *Attorney, Agent, or Firm*—Banner & Witcoff, Ltd

(57) ABSTRACT

Disclosed is a semiconductor light-emitting element, comprising an n-type cladding layer; a light guide layer positioned on the n-type cladding layer; a multiple quantum well structure active layer positioned on the light guide layer; a p-type carrier overflow prevention layer positioned on the active layer and having an impurity concentration of $5 \times 10^{18}$ $cm^{-3}$ to not more than $3 \times 10^{19}$ $cm^{-3}$; a p-type light guide layer positioned on the p-type carrier overflow prevention layer and having an impurity concentration of $1 \times 10^{18}$ $cm^{-3}$ or more and less than that of the p-type carrier overflow prevention layer; and a p-type cladding layer positioned on the p-type light guide layer and having a band gap narrower than the p-type carrier overflow prevention layer, and a method of manufacturing the same.

18 Claims, 4 Drawing Sheets

SEMICONDUCTOR LIGHT-EMITTING ELEMENT AND METHOD OF MANUFACTURING THE SAME

CROSS REFERENCE TO RELATED APPLICATIONS

This application is based upon and claims the benefit of priority from the prior Japanese Patent Application No. 2003-296423, filed on Aug. 20, 2003 and Japanese Paten Application No. 2004-227579, filed on Aug. 4, 2004; the entire contents of which are incorporated herein by reference.

BACKGROUND

1. Field of the Invention

The present invention relates-to-a semiconductor light-emitting element which produces light by the recombination of a carrier in a semiconductor and a method of manufacturing the same, and more particularly to a semiconductor light-emitting element suitable for blue light emission and a method of manufacturing the same.

2. Description of the Related Art

A blue (bluish purple) semiconductor light-emitting element, for example, a 400-nm band semiconductor laser element, adopts a structure having a p-type carrier overflow prevention layer between an active layer and a p-side light guide layer to effectively confine a carrier. Such a structure is disclosed in, for example, Japanese Patent Laid-Open Applications No. 2000-299497 and No. HEI 11-340580. According to the former literature, a p-type electron confining layer corresponding to the p-type carrier overflow prevention layer is formed by growing a crystal by raw material gas containing gas having an impurity. And, a light guide layer (p side) is formed on the formed electron confining layer by undoping, and the light guide layer is rendered to be a p-type semiconductor by diffusion of the impurity from the electron confining layer. The impurity concentration is inevitably small to $5 \times 10^{15}$ cm$^{-3}$ because of a process of diffusion.

The latter literature discloses that the impurity (magnesium) concentration in an electron block layer corresponding to the p-type carrier overflow prevention layer in a similar structure is determined to be $7 \times 10^{19}$ cm$^{-3}$ or more.

[Patent Document 1]
Japanese Patent Laid-Open Application No. 2000-299497 (FIG. 5, paragraphs 0041, 0042)

[Patent Document 2]
Japanese Patent Laid-Open Application No. HEI 11-340580

The p-type carrier overflow prevention layer provides an effect of effectively confining electrons, which are supplied from the n side, on the active-layer because the band gap is large. But, it is also necessary to consider an influence of the disposed p-type carrier overflow prevention layer on the carrier supplied from the p side. This fact was found by the present inventors by making a study. Especially, the impurity concentrations in the p-type carrier overflow prevention layer and the p-side light guide layer become a problem. Depending on the values of the impurity concentrations, they become a barrier against the carrier supplied from the p side in the process of reaching the active layer and prevent the carrier from recombining in the active layer, resulting in degradation of properties that the operating voltage is increased, the light emission efficiency is degraded, and the like.

SUMMARY

The semiconductor light-emitting element according to one aspect of the present invention comprises an n-type cladding layer; a light guide layer positioned on the n-type cladding layer; a multiple quantum well structure active layer positioned on the light guide layer; a p-type carrier overflow prevention layer positioned on the active layer and having an impurity concentration of $5 \times 10^{18}$ cm$^{-3}$ to not more than $3 \times 10^{19}$ cm$^{-3}$; a p-type light guide layer positioned on the p-type carrier overflow prevention layer and having an impurity concentration of $1 \times 10^{18}$ cm$^{-3}$ or more and less than that of the p-type carrier overflow prevention layer; and a p-type cladding layer positioned on the p-type light guide layer and having a band gap narrower than the p-type carrier overflow prevention layer.

The method of manufacturing a semiconductor light-emitting element according to an aspect of the present invention comprises forming an n-type cladding layer on an n-type substrate; forming a light guide layer on the formed n-type cladding layer; forming a multiple quantum well structure active layer on the formed light guide layer; forming a p-type carrier overflow prevention layer on the formed active layer; growing a p-type light guide layer on the formed p-type carrier overflow prevention layer while doping an impurity to have an impurity concentration lower than that in the p-type carrier overflow prevention layer; and forming a p-type cladding layer on the formed p-type light guide layer.

DETAILED DESCRIPTION

Description of Embodiments

Figure 1:
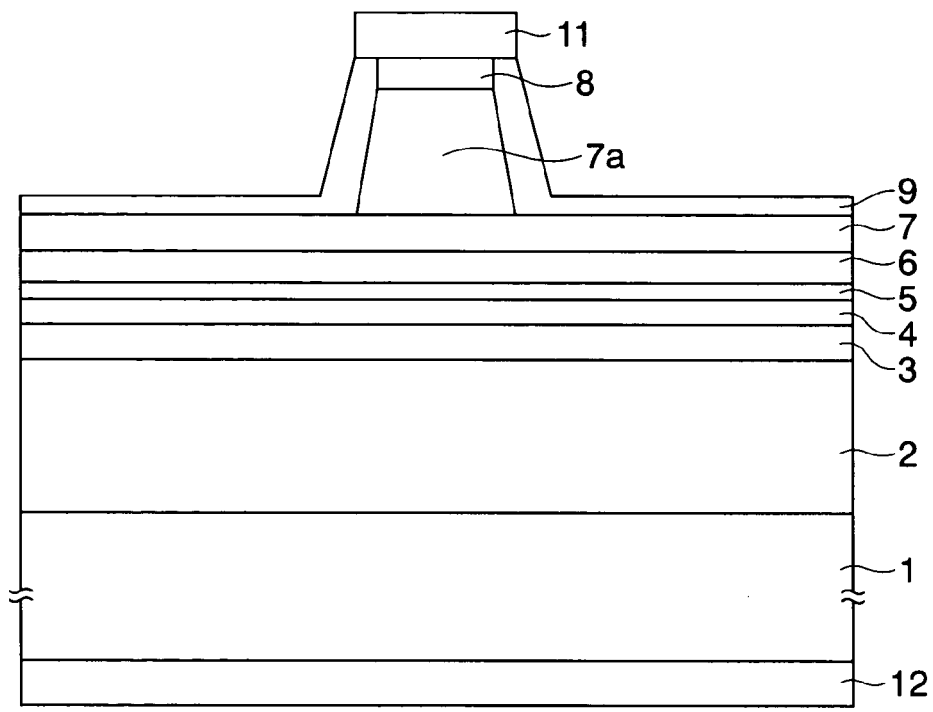
FIG. 1 is a front view-showing a-schematic structure of a blue (or bluish purple, the same is applied hereinafter) semiconductor laser element as a semiconductor light-emitting element according to an embodiment of the present invention.

Embodiments will be described with reference to the drawings but it is to be understood that the drawings are provided for illustration only and the-invention is not limited to the drawings.

According to an aspect of the invention, a barrier against a carrier from a p side in a p-type light guide layer disappears substantially by formation of the p-type light guide layer which has an impurity concentration determined to be $1 \times 10^{18}$ cm$^{-3}$ or more by doping the impurity. By forming a p-type carrier overflow prevention layer which has an impurity concentration of $5 \times 10^{18}$ cm$^{-3}$ or more and $3 \times 10^{19}$ cm$^{-3}$ or less higher than that in the p-type light guide layer, the barrier against the carrier from the p side in the p-type carrier overflow prevention layer disappears substantially. Therefore, the function of the p-type carrier overflow prevention layer for keeping efficiently the carrier from the n side in the active-layer is maintained as it is, and the carrier from the p side can reach the active layer without passing the barrier. As a result, a low voltage operation and a highly efficient light emission are achieved.

The semiconductor light-emitting element as a mode of the invention is further provided with an n-type carrier overflow prevention layer disposed between the light guide layer and the active layer. The light guide layer is an n type, and the n-type carrier overflow prevention layer can be configured to have a band gap wider than the n-type cladding layer. It is a structure to make the same effect as the carrier confining effect by the p-type carrier overflow prevention layer to act on the carrier having the opposite polarity.

As a mode of the present invention, it may be configured that the light guide layer is an n type and has a layer structure that an impurity concentration becomes higher in a portion closer to the active layer. This structure enhances the confining effect of the carrier (hole) from the p side to the active layer by an n barrier of the n-type light guide layer. The mobility of the hole is lower than that of the electrons, and the hole confining effect can be enhanced by a lower barrier.

As an embodiment of the invention, the n-type cladding layer and the p-type cladding layer each have a composition $Al_vGa_{1-v}N$ ($0.0<v\leq0.3$) or a superlattice ($0.0<v\leq0.3$) of $Al_vGa_{1-v}N/GaN$, the light guide layer and the p-type light guide layer have a composition $In_wGa_{1-w}N$ ($0.0\leq w\leq1.0$), the active layer has a composition $In_xGa_{1-x}N/In_yGa_{1-y}N$ ($0.05\leq x\leq1.0$, $0.0\leq y\leq1.0$, $x>y$), and the p-type carrier overflow prevention layer has a composition $Al_zGa_{1-z}N$ ($z>v$). They are material systems for obtaining the emission of light of 400-nm band (for example, 400 nm to 410 nm). In the $In_xGa_{1-x}N/In_yGa_{1-y}N$ in the active layer, the first half section before "/" is the composition of the quantum well layer and the second half is the composition of the barrier layer which separates the quantum well layers from each other. The number of quantum wells can be set to, for example, three to four.

Based on the above description, the embodiments of the present invention will be described below with reference to the accompanying drawings. FIG. 1 is a front view showing a schematic structure of a blue (or bluish purple, the same is applied hereinafter) semiconductor laser element as a semiconductor light-emitting element according to an embodiment of the present invention. When viewed in the direction perpendicular to the sheet, a sectional structure is the same as seen in FIG. 1. Briefly, this blue semiconductor laser element is an edge-emitting type semiconductor laser element, and both end faces in the direction perpendicular to the sheet become a crystalline cleaved surface to form a resonator. The light emission portion is concentrated in the horizontal direction by a ridge-type waveguide 7a having a ridge shape, light is guided between light guide layers 3 and 6 in the vertical direction, and a laser beam is emitted from the edge surface of an active layer 4.

More specifically, the structure has a laminated structure comprising an n-side electrode 12, an n-GaN substrate 1, an n-$Al_{0.08}Ga_{0.92}N$ cladding layer 2, an n-GaN light guide layer 3, an $In_{0.15}Ga_{0.85}N/In_{0.02}Ga_{0.98}N$ MQW (Multiple Quantum Well) active layer 4, a p$^+$-$Al_{0.2}Ga_{0.8}N$ carrier overflow prevention layer 5, a p-GaN light guide layer 6, and a p-$Al_{0.08}Ga_{0.92}N$ cladding layer 7 in this order from below as shown in FIG. 1. It is a so-called double heterojunction structure.

The p-$Al_{0.08}Ga_{0.92}N$ cladding layer 7 is fabricated to have a ridge portion, which forms a ridge-type waveguide 7a. A p$^+$-GaN contact layer 8 is formed on the ridge-type waveguide 7a. A silicon oxide film 9 is formed on both side faces of the ridge-type waveguide 7a and the contact layer 8 and on the cladding layer 7 excepting the ridge-type waveguide 7a. A p-side electrode 11 is disposed on the p$^+$-GaN contact layer 8. An electric current is flown between the electrodes 11 and 12 to obtain a laser beam having a wavelength of, for example, 400 nm to 410 nm, which are suitable for an HD-DVD (high definition digital versatile disc) or a Blue-ray Disc for example.

For example, the semiconductor laser element shown in FIG. 1 is produced as follows. First, the n-$Al_{0.08}Ga_{0.92}N$ cladding layer 2, the n-GaN light guide layer 3, the $In_{0.15}Ga_{0.85}N/In_{0.02}Ga_{0.98}N$ MQW active layer 4, the p$^+$-$Al_{0.2}Ga_{0.8}N$ carrier overflow prevention layer 5, the p-GaN light guide layer 6, the p-$Al_{0.08}Ga_{0.92}N$ cladding layer 7 and the p$^+$-GaN contact layer 8 are sequentially formed by growing crystals on the n-GaN substrate 1. Such crystals can be grown by, for example, an MOCVD (metal organic chemical vapor deposition) method or an MBE (molecular beam epitaxy) method.

For example, silicon can be used as an impurity for providing the n type, and, for example, magnesium can be used as an impurity for providing the p type. When the MOCVD method is used, gas containing such elements is mixed into raw material gas to dope. Among them, special attention must be paid to the impurity concentrations of the carrier overflow prevention layer 5 and the light guide layer 6 (details will be described later).

As to the thicknesses of the individual layers, for example, the cladding layer 2 is 1 μm, the light guide layer 3 is 100 nm, the active layer 4 is 40 nm, the carrier overflow prevention layer 5 is 10 nm to 30 nm (more specifically, 20 nm for example), the light guide layer 6 is 50 nm to 200 nm (more specifically, 100 nm for example), the cladding layer 7 is 1 μm, and the contact layer 8 is 100 nm. The substrate 1 originally has a thickness of several hundreds micrometers and its back surface is polished in a later step (to have a thickness of about 100 μm finally). And, the active layer 4 has a multilayered structure of plural $In_{0.15}Ga_{0.85}N$ quantum well layers and $In_{0.02}Ga_{0.98}N$ barrier layers, which are arranged in 2.5 pairs to 5.5 pairs (more specifically, 4.5 pairs for example). Each of the quantum well layers has a thickness of, for example, 2 nm to 8 nm (more specifically, 3 nm for example), and each of the barrier layers has a thickness of, for example, 4 nm to 10 nm.

Then, the p$^+$-GaN contact layer 8 and the p-Al$_{0.08}$Ga$_{0.92}$N cladding layer 7 are fabricated to some level (to remain the cladding layer 7 with a thickness of, for example, 50 nm to 400 nm) to form a stripe having a width of, for example, 1.5 μm to 3 μm, thereby forming the ridge-type waveguide 7a. In addition, a dielectric film such as the silicon-oxide film 9 is formed on the entire surface excepting the top surface of the contact layer 8 by, for example, a CVD (chemical vapor deposition) method. Besides, the p-side electrode 11 is formed on the top surface of the contact layer 8, and the n-side electrode 12 is formed on the bottom surface of the n-GaN substrate 1 after polishing it. The p-side electrode 11 has a laminated structure including a layer of, for example, platinum and can be formed by, for example, vapor deposition. The n-side electrode 12 has a laminated structure comprising, for example, titanium, platinum and gold from the side of the substrate 1 and can be formed by the vapor deposition. The silicon oxide film 9 has a thickness of, for example, 300 nm, and the p-side electrode 11 and the n-side electrode 12 each have a thickness of, for example, 300 nm.

Then, the structure having the individual layers formed as described above is cleaved (so-called bar cleavage) to expose a surface to form the resonator edge surfaces. Subsequently, the laser element undergone the bar cleavage is cut in a direction perpendicular to the cleaved surfaces. Thus, the semiconductor laser element shown in FIG. 1 can be obtained. A single laser element shown in FIG. 1 has a width of, for example, about 200 μm to about 300 μm, a depth perpendicular to the sheet of, for example, about 500 μm to about 800 μm and a height of, for example, a little over 100 μm.

Figure 2:
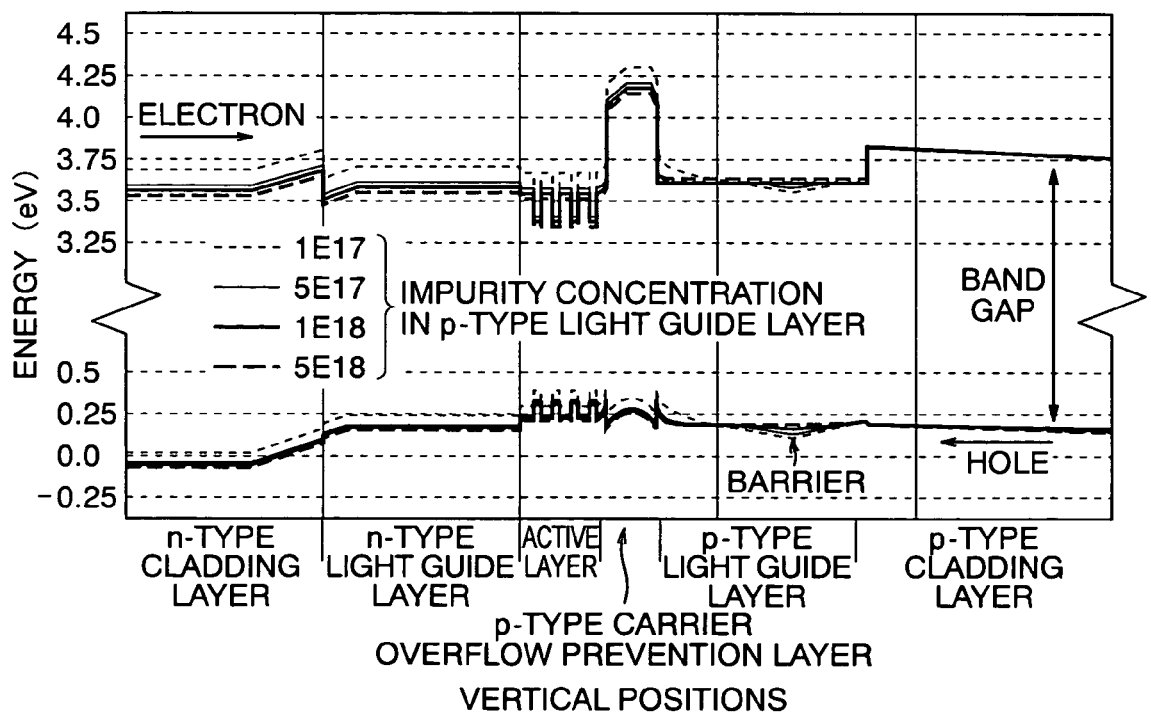
FIG. 2 is a diagram (calculated values: simulation; the impurity concentration in a light guide layer 6 determined as a parameter) showing an example of the band in the vicinity of an active layer 4 of the semiconductor laser element shown in FIG. 1.

FIG. 2 is an example (calculated values: simulation) of a diagram of bands near the active layer 4 of the semiconductor laser element shown in FIG. 1. In this drawing, there exists an impurity concentration in the light guide layer 6 (p-type light guide layer) as a parameter. The horizontal axis represents the positions of the individual layers of the semiconductor laser element, and the vertical axis represents energy. The portion between lines drawn in the vicinity of energy −0.1 eV to 0.5 eV and lines drawn in the vicinity of energy 3.3 eV to 4.3 eV is a band gap, the portion above the band gap is a conduction band and the portion below it is a valence band. As other conditions, it is determined that the carrier overflow prevention layer 5 has a sufficiently high impurity concentration of $2\times10^{19}$ cm$^{-3}$ and the cladding layer 7 has an impurity concentration of $5\times10^{18}$ cm$^{-3}$ (in the drawing, for example, the impurity concentration is indicated as 1E17 instead of $1\times10^{17}$ cm$^{-3}$).

It is seen from FIG. 2 that a band gap becomes large on the carrier overflow prevention layer 7 (p-type carrier overflow prevention layer), and the carrier overflow prevention layer 7 becomes an effective barrier which prevents the electron that is a carrier supplied from the n side from passing through the active layer 4. As a guide, the band gap is determined to be larger than that of the cladding layer 7 (p-type cladding layer). When the band gap is large, the size of the barrier is substantially constant as a relative value to the active layer 4 even if the impurity concentration in the light guide layer 6 (p-type light guide layer) is changed.

Meanwhile, a hole which is a carrier supplied from the p side might be disturbed its movement by the barrier below the band gap as shown in the drawing depending on the impurity concentration in the light guide layer 6 (p-type light guide layer). Such a barrier prevents the hole from reaching the active layer 4, so that the carrier recombination is prevented, causing a deterioration of the light emission efficiency or an increase in the operating voltage. To remove substantially the barrier against the hole in the light guide layer 6 (p-type light guide layer), it is necessary to set the impurity concentration to $1\times10^{18}$ cm$^{-3}$ or more as shown in the drawing. According to such an impurity concentration, the barrier below the band gap against the hole disappears substantially, and the low voltage operation and highly efficient emission are achieved. Such a high impurity concentration cannot be achieved by the diffusion of the impurity doped in the carrier overflow prevention layer 5.

Figure 3:
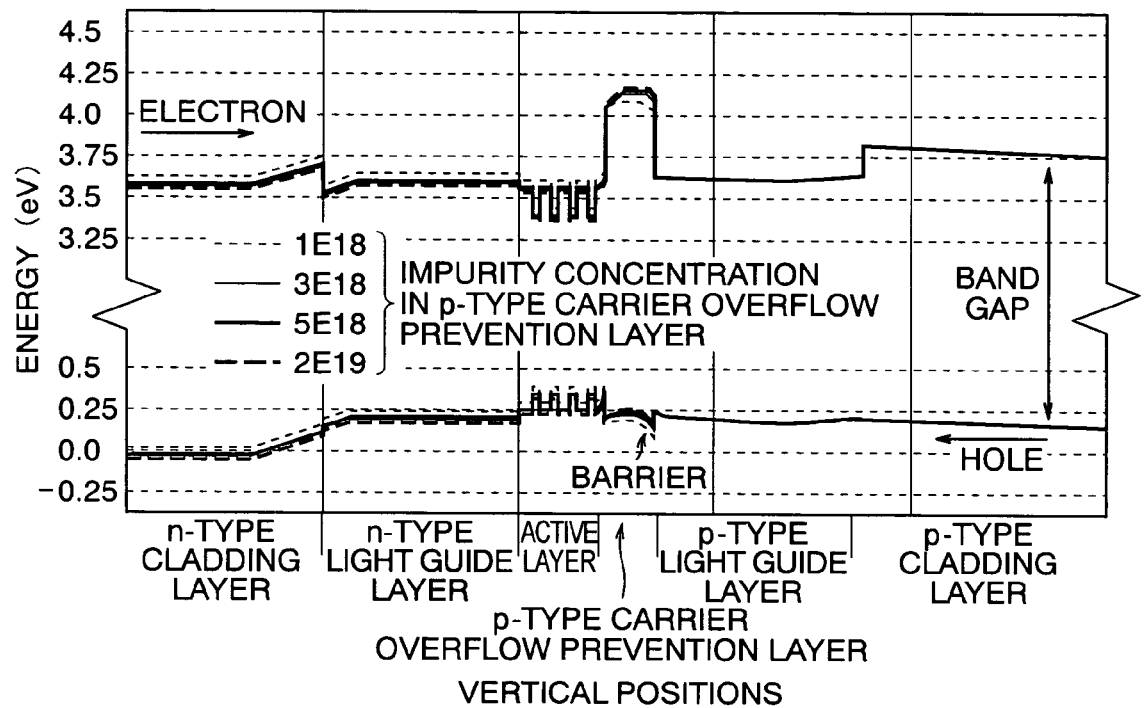
FIG. 3 is a diagram (calculated value: simulation; the impurity concentration in a carrier overflow prevention layer 5 determined as a parameter) showing an example of the band in the vicinity of the active layer 4 of the semiconductor laser element shown in FIG. 1.

FIG. 3 is an example (calculated values: simulation) of a diagram of bands near the active layer 4 of the semiconductor laser element shown in FIG. 1 with the parameters changed from those of FIG. 2. In FIG. 3, there exists an impurity concentration of the carrier overflow prevention layer 5 (p-type carrier overflow prevention layer) as a parameter, and FIG. 3 is viewed in the same way as FIG. 2. As other conditions, the impurity concentration of the light guide layer 6 (p-type light guide layer) is determined to be a minimal concentration of $1\times10^{18}$ cm$^{-3}$ derived from FIG. 2, and the impurity concentration in the cladding layer 7 is determined to be $5\times10^{18}$ cm$^{-3}$ in the same way as shown in FIG. 2.

It is seen from FIG. 3 that the barrier against the hole supplied from the n side is formed in the carrier overflow prevention layer 5 (p-type carrier overflow prevention layer) when the impurity concentration in the carrier overflow prevention layer 5 (p-type carrier overflow prevention layer) is decreased successively from $2\times10^{19}$ cm$^{-3}$. Such a barrier also prevents the hole from reaching the active layer 4, so that the carrier recombination is prevented, causing a deterioration of the light emission efficiency or an increase in the operating voltage.

To eliminate substantially the barrier against the hole in the carrier overflow prevention layer 5 (p-type carrier overflow prevention layer), it is necessary to set the impurity concentration to $5\times10^{18}$ cm$^{-3}$ as shown in the drawing. According to the above impurity concentration, the barrier below the band gap against the hole disappears substantially, and the low voltage operation and the highly efficient emission are achieved. The electron confining effect of the carrier overflow prevention layer 5 (p-type carrier overflow prevention layer) to the active layer is not influenced substantially when the impurity concentration is $5\times10^{18}$ cm$^{-3}$.

Figure 4:
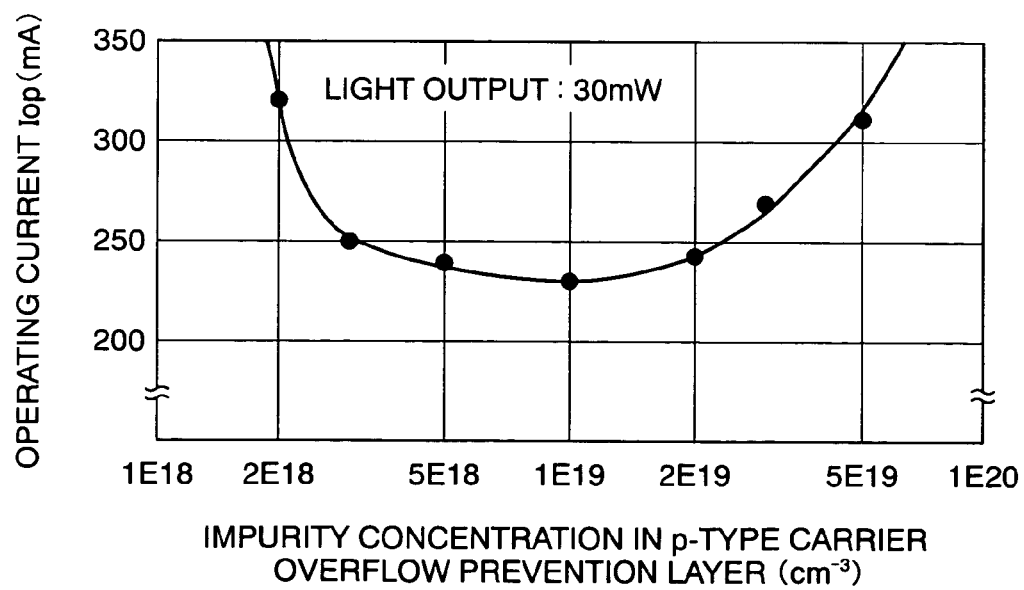
FIG. 4 is a diagram showing the results (calculated values) of determining an operating current with regard to an impurity concentration in the carrier overflow prevention layer 5 of the semiconductor laser element shown in FIG. 1.

FIG. 4 shows the results (calculated values: simulation) of determining the operating current Iop of the semiconductor laser element with regard to an impurity concentration in the carrier overflow prevention layer 5 (p-type carrier overflow prevention layer) in order to check the influences when the impurity concentration in the carrier overflow prevention layer 5 (p-type carrier overflow prevention layer) is excessively increased contrary to the case of FIG. 3. As other conditions of FIG. 4, both the impurity concentration in the p-type light guide layer 6 and the impurity concentration in the cladding layer 7 are $1\times10^{18}$ cm$^{-3}$ and $5\times10^{18}$ cm$^{-3}$ in the same way as in the case of FIG. 3. And, it is when the light output is 30 mW.

It is seen from FIG. 4 that, when it is $5\times10^{18}$ cm$^{-3}$ or more as the impurity concentration in the carrier overflow prevention layer 5 which is the result derived from FIG. 3, the operating current Iop is stable at a relatively low value falling in a prescribed range ($1\times10^{19}$ cm$^{-3}$, $2\times10^{19}$ cm$^{-3}$). But, it is seen that the operating current Iop increases conspicuously when the value exceeds about $3\times10^{19}$ cm$^{-3}$. Therefore, $3\times10^{19}$ cm$^{-3}$ becomes a certain guide as the upper limit impurity concentration.

In FIG. 1, the cladding layer 2 and the cladding layer 7 can be generally made to be a composition of $Al_vGa_{1-v}N$ ($0.0<v\leq0.3$) or a superlattice of a composition of $Al_vGa_{1-v}N$/GaN ($0.0<v\leq0.3$). This superlattice has a structure obtained as a laminated layer of several tens to several hundreds of pairs of the $Al_vGa_{1-v}N$ films and the GaN films. And, the light guide layer 3 and the light guide layer 6 can be generally made to have a composition of $In_wGa_{1-w}N$ ($0.0\leq w\leq1.0$), the active layer 4 can be generally made to have a composition of $In_xGa_{2-x}N/In_yGa_{1-y}N$ ($0.05\leq x\leq1.0$, $0.0\leq y\leq1.0$, x>y), and the carrier overflow prevention layer 5 can be generally made to have a composition of $Al_zGa_{1-z}N$ (z>v). The light-guide layer 3 on the n side may not be-made positively to be an n type.

Figure 5:
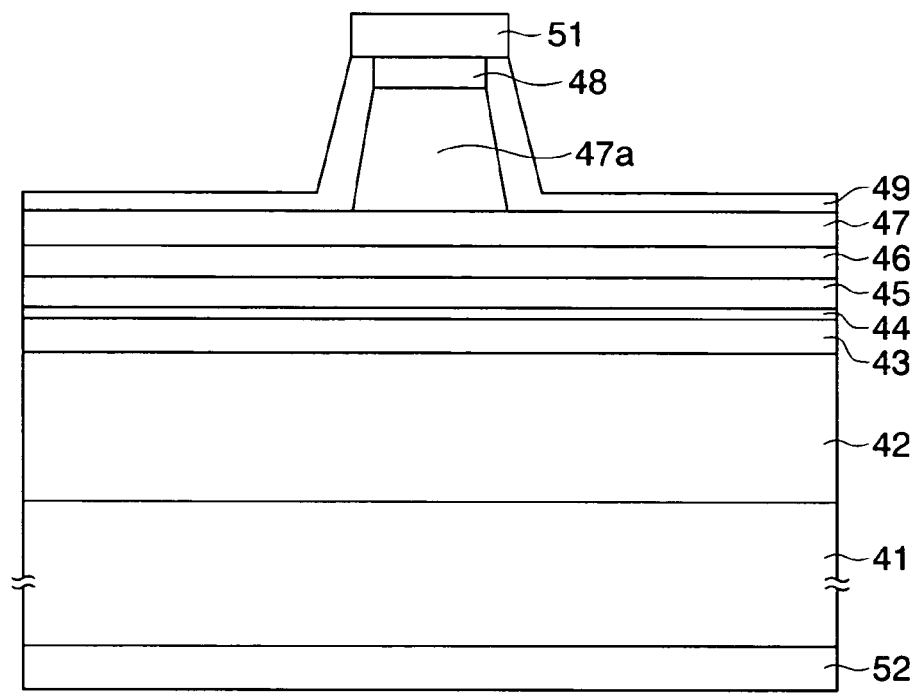
FIG. 5 is a front view showing a schematic structure of a blue semiconductor laser element as the semiconductor light-emitting element according to another embodiment of the present invention.

Then, an embodiment different from the one shown in FIG. 1 will be described with reference to FIG. 5. FIG. 5 is a front view showing a schematic structure of a blue semiconductor laser element as the semiconductor light-emitting element according to another embodiment of the present invention. When viewed in the direction perpendicular to the sheet, a sectional structure is the same as seen in FIG. 5. Briefly, the blue semiconductor laser element is the same edge-emitting type semiconductor laser element as the one shown in FIG. 1. In this embodiment, a p-type semiconductor is used as a substrate 41, which is determined as a p side, and an electrode 51 on the top is determined as an n side.

More specifically, it is configured to have a laminated structure comprising a p-side electrode 52, a p-type substrate 41, a p-type cladding layer 42, a p-type light guide layer 43, a $p^+$ type carrier overflow prevention layer 44, an MQW active layer 45, an n-type light guide layer 46 and an n-type cladding layer 47 from below-as shown in FIG. 5. The n-type cladding layer 47 is fabricated so to have a bridge portion, and the ridge portion is a ridge-type waveguide 47a. An $n^+$ type contact layer 48 is formed on the ridge-type waveguide 47a. A silicon oxide film 49 is formed on both side faces of the ridge-type waveguide 47a and the contact layer 48 and on the cladding layer 47 excepting the ridge-type waveguide 47a, and the n-side electrode 51 is disposed on the $n^+$ contact layer 48. A laser beam having a wavelength of, for example, 400 nm to 410 nm can be obtained by flowing an electric current between the electrodes 52 and 51.

Even the semiconductor laser element configured as described above can have the relationship between the p-type light guide layer 43 and the $p^+$ type carrier overflow prevention layer 44 made to be equal to the relationship between the p-GaN light guide layer 6 and the $p^+$-$Al_{0.2}Ga_{0.8}N$ carrier overflow prevention layer 5 in the embodiment of FIG. 1. Specifically, as their relationship, the conductive type is same and the direction of an electric current is also same as the semiconductor. Therefore, the relationship of their impurity concentrations can be set in the same way as in the embodiment shown in FIG. 1 to obtain a semiconductor laser element having a low voltage operation and a highly efficient emission.

Figure 6:
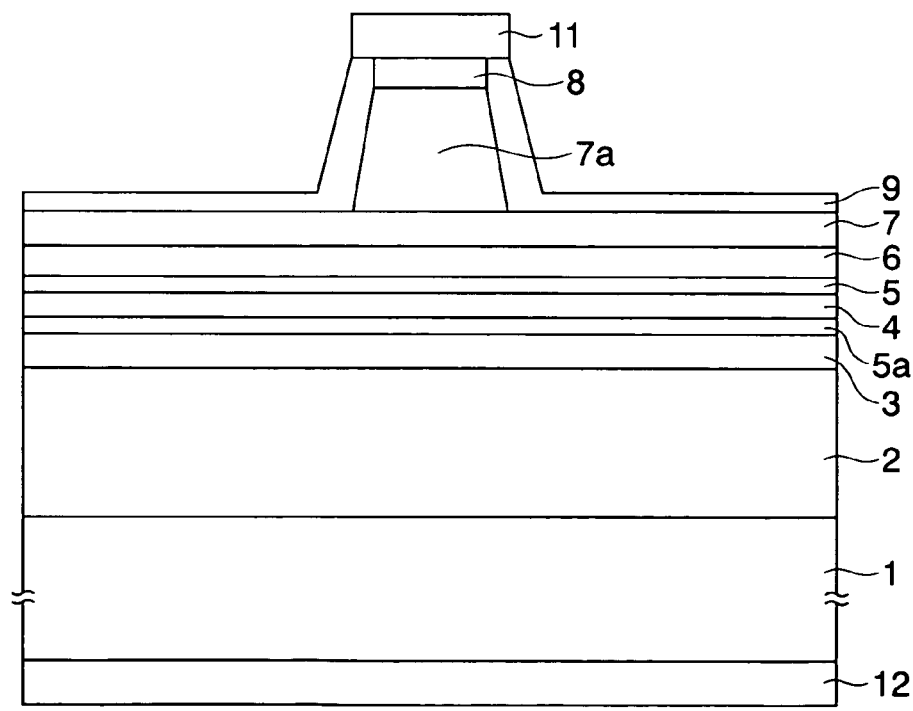
FIG. 6 is a front view showing a schematic structure of a blue semiconductor laser element as the semiconductor light-emitting element according to still another embodiment of the present invention.

Then, an embodiment different from the above-described embodiments will be described with reference to FIG. 6. FIG. 6 is a front view showing a schematic structure of a blue semiconductor laser element as the semiconductor light-emitting element according to still another embodiment of the present invention. When viewed in the direction perpendicular to the sheet, a sectional structure is the same as seen in FIG. 6. In FIG. 6, the same reference numerals are allotted to the same elements as those shown in FIG. 1. Briefly, this blue semiconductor laser element is the same edge-emitting type semiconductor laser element as the one shown in FIG. 1 except that an $n^+$ type carrier overflow prevention layer 5a is disposed between the light guide layer 3 and the active layer 4.

The $n^+$ type carrier overflow prevention layer 5a has a function to keep the hole supplied from the p side (the upper side in the drawing) in the active layer 4 as the $p^+$-$Al_{0.2}Ga_{0.8}N$ carrier overflow-prevention layer 5 produces the effect to keep the electrons in the active layer 4. Thus, the recombination of the carrier is performed more frequently, and the efficient emission of light is realized. The band gap of the $n^+$ type carrier overflow prevention layer 5a is made larger than that of the n-side cladding layer 2 as a guide to assure the above-described function.

Figure 7:
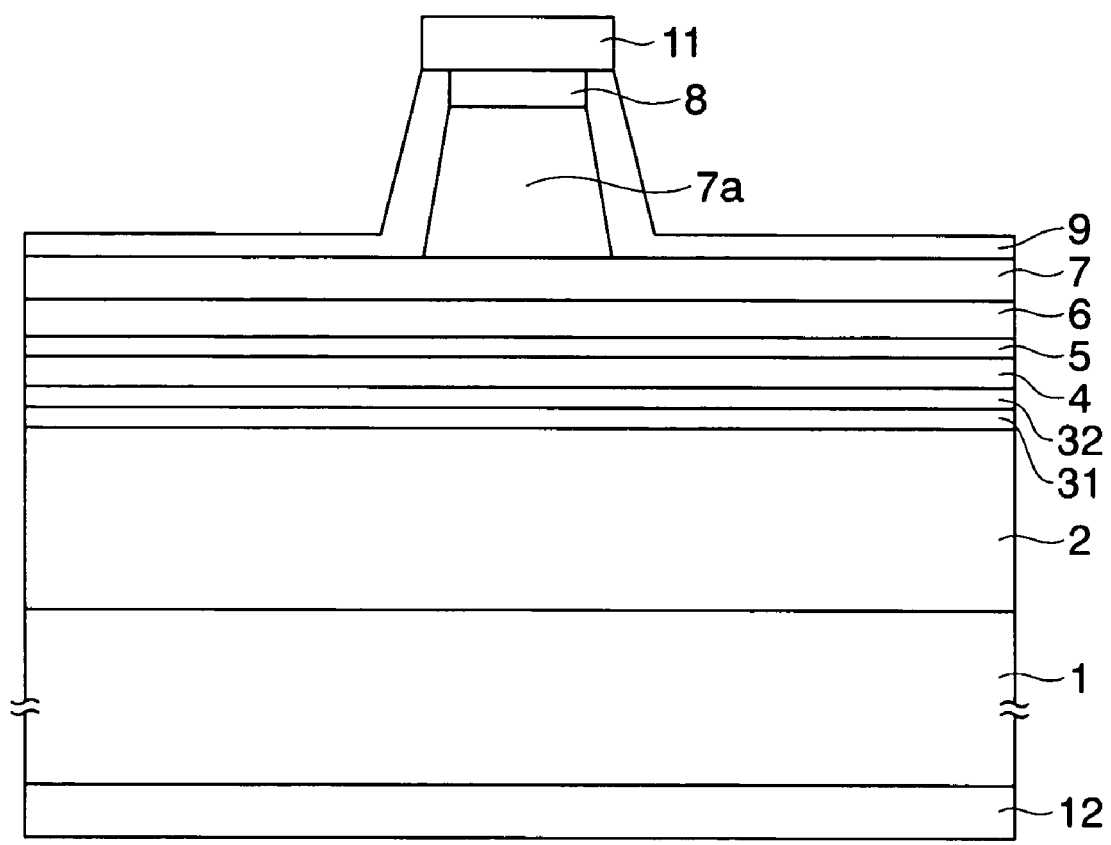
FIG. 7 is a front view showing a schematic structure of a blue semiconductor laser element as the semiconductor light-emitting element according to yet another embodiment of the present invention.

Then, an embodiment different from the above-described individual embodiments will be described with reference to FIG. 7. FIG. 7 is a front view showing a schematic structure of a blue semiconductor laser element as the semiconductor light-emitting element according to yet another embodiment of the present invention. When viewed in the direction perpendicular to the sheet, a sectional structure is the same as seen in FIG. 7. In FIG. 7, the same reference numerals are allotted to the same elements as those shown in FIG. 1. Briefly, this blue semiconductor laser element is the same edge-emitting type semiconductor laser element as the one shown in FIG. 1 except that the light guide layer 3 is divided into two layers having a different impurity concentration.

Specifically, instead of the light guide layer 3, an $n^+$-GaN layer 32 is disposed closer to the active layer 4, and an n-GaN layer 31 is disposed far from it. By configuring as described above, a barrier against a hole can be formed on the n side of the active layer 4. Therefore, the hole can be efficiently kept in the active layer 4 to promote the efficient light emission. Even a lower barrier is effective because the mobility of the hole is smaller than that of the electrons.

To form the two light guide layers 31, 32, the concentration of gas containing the impurity contained in the raw material gas may be changed (increased) during the growth of the crystal by, for example, the MOCVD method. It may also be configured to increase gradually the concentration of the gas containing the impurity during the growth of the crystal. In the latter case, the two layers are not distinct in the film, and the impurity concentration changes gradually in the thickness direction in the film, but this film has the same function.

It is to be understood that the present invention is not limited to the specific embodiments thereof illustrated herein, and various modifications may be made without departing from the scope of the claims of the invention.

What is claimed is:

1. A semiconductor light-emitting element, comprising:
   an n-type cladding layer;
   a light guide layer positioned on the n-type cladding layer;
   a multiple quantum well structure active layer positioned on the light guide layer;
   a p-type carrier overflow prevention layer positioned on the active layer and having an impurity concentration of $5\times10^{18}$ cm$^{-3}$ to not more than $3\times10^{19}$ cm$^{-3}$;
   a single p-type light guide layer positioned directly on the p-type carrier overflow prevention layer, an entire region of the single p-type light guide layer having an impurity concentration of $1\times10^{18}$ cm$^{-3}$ or more and less than that of the p-type carrier overflow prevention layer; and
   a p-type cladding layer positioned directly on the single p-type light guide layer and having a band gap narrower than the p-type carrier overflow prevention layer,
   wherein of the n-type cladding layer, the light guide layer, the multiple quantum well structure active layer, the p-type carrier overflow prevention layer, the single p-type light guide layer, and the p-type cladding layer, only the p-type cladding layer has a ridge potion, and wherein the n-type cladding layer and the p-type cladding layer each have a composition $Al_vGa_{1-v}N$ $(0.0 < v \leq 0.3)$ or a superlattice of a composition $Al_vGa_{1-v}N/GaN$ $(0.0 < v \leq 0.3)$, the light guide layer has a composition $In_wGa_{1-w}N$ $(0.0 \leq w \leq 1.0)$, the active layer has a composition $In_xGa_{1-x}N/In_yGa_{1-y}N$ $(0.05 \leq x \leq 1.0, 0.0 \leq y)$, the single p-type light guide layer has a composition GaN, and the p-type carrier overflow prevention layer has a composition $Al_zGa_{1-z}N$ $(z > v)$.

2. The semiconductor light-emitting element as set forth in claim 1, further comprising an n-type carrier overflow prevention layer positioned between the light guide layer and the active layer, wherein the light guide layer is an n type, and the n-type carrier overflow prevention layer has a band gap wider than the n-type cladding layer.

3. The semiconductor light-emitting element as set forth in claim 1, wherein the light guide layer is an n type, and has a layered structure whose impurity concentration increases in a portion closer to the active layer.

4. The semiconductor light-emitting element as set forth in claim 1, wherein an n-type substrate is disposed on the n-type cladding layer on a side opposite to the light guide layer.

5. The semiconductor light-emitting element as set forth in claim 1, wherein the impurity in the p-type carrier overflow prevention layer is magnesium.

6. The semiconductor light-emitting element as set forth in claim 1, wherein the impurity in the single p-type light guide layer is magnesium.

7. The semiconductor light-emitting element as set forth in claim 1, wherein the p-type carrier overflow prevention layer has a thickness of 10 nm to 30 nm.

8. The semiconductor light-emitting element as set forth in claim 1, wherein the single p-type light guide layer has a thickness of 50 nm to 200 nm.

9. The semiconductor light-emitting element as set forth in claim 1, wherein the impurity in the n-type cladding layer is silicon.

10. The semiconductor light-emitting element as set forth in claim 1, wherein the p-type cladding layer has an impurity concentration of approximately $5 \times 10^{18}$ $cm^{-3}$.

11. The semiconductor light-emitting element as set forth in claim 1, wherein the light guide layer has an n-type impurity.

12. The semiconductor light-emitting element as set forth in claim 1, wherein the multiple quantum well structure active layer has a laminated structure of 2.5 pairs to 5.5 pairs of quantum well layers and barrier layers.

13. The semiconductor light-emitting element as set forth in claim 12, wherein the quantum well layer each has a thickness of 2 nm to 8 nm.

14. The semiconductor light-emitting element as set forth in claim 12, wherein the barrier layer each has a thickness of 4 nm to 10 nm.

15. The semiconductor light-emitting element as set forth in claim 1, wherein a dielectric film is formed on a top surface of the p-type cladding layer and on side surfaces of the ridge portion.

16. The semiconductor light-emitting element as set forth in claim 1, wherein the ridge portion of the p-type cladding layer has a width of 1.5 μm to 3 μm.

17. The semiconductor light-emitting element as set forth in claim 1, wherein the p-type cladding layer has a thickness of 50 nm to 400 nm excepting the ridge portion thereof.

18. The semiconductor light-emitting element as set forth in claim 1, further comprising a p-type GaN layer positioned on the ridge portion of the p-type cladding layer.

* * * * *

UNITED STATES PATENT AND TRADEMARK OFFICE
CERTIFICATE OF CORRECTION

PATENT NO. : 7,554,127 B2  Page 1 of 1
APPLICATION NO. : 10/917521
DATED : June 30, 2009
INVENTOR(S) : Akira Tanaka et al.

It is certified that error appears in the above-identified patent and that said Letters Patent is hereby corrected as shown below:

In Column 9, Claim 1, Line 8:
Please delete "($0.05 \leq x \leq 1.0, 0.0 \leq y$)" and insert --($0.05 \leq x \leq 1.0, 0.0 \leq y \leq 1.0, x > y$)--

Signed and Sealed this

First Day of December, 2009

David J. Kappos
*Director of the United States Patent and Trademark Office*